US006586314B1

(12) United States Patent
Siah et al.

(10) Patent No.: US 6,586,314 B1
(45) Date of Patent: Jul. 1, 2003

(54) METHOD OF FORMING SHALLOW TRENCH ISOLATION REGIONS WITH IMPROVED CORNER ROUNDING

(75) Inventors: Soh Yun Siah, Singapore (SG); Liang Choo Hsia, Singapore (SG); Jia Zhen Zheng, Singapore (SG); Chew Hoe Ang, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/266,952

(22) Filed: Oct. 8, 2002

(51) Int. Cl.[7] ............... H01L 21/76; H01L 21/8242; H01L 21/425
(52) U.S. Cl. ............. 438/424; 438/243; 438/246; 438/248; 438/425; 438/426; 438/514; 438/524
(58) Field of Search ............... 438/243, 246, 438/248, 424, 425, 426, 514, 524

(56) References Cited

U.S. PATENT DOCUMENTS

| | | | | |
|---|---|---|---|---|
| 4,538,343 A | * | 9/1985 | Pollack et al. | |
| 5,068,202 A | * | 11/1991 | Crotti et al. | |
| 5,753,561 A | * | 5/1998 | Lee et al. | |
| 5,895,253 A | * | 4/1999 | Akram | |
| 6,037,018 A | | 3/2000 | Jang et al. | 427/579 |
| 6,084,276 A | | 7/2000 | Gambino et al. | 257/397 |
| 6,165,871 A | * | 12/2000 | Lim et al. | |
| 6,180,493 B1 | * | 1/2001 | Chu | |
| 6,207,532 B1 | | 3/2001 | Lin et al. | 438/424 |
| 6,248,641 B1 | * | 6/2001 | Liu et al. | |
| 6,265,281 B1 | | 7/2001 | Reinberg | 438/400 |
| 6,297,130 B1 | * | 10/2001 | Rao | |
| 6,440,817 B2 | * | 8/2002 | Trivedi | |
| 6,444,539 B1 | * | 9/2002 | Sun et al. | |

FOREIGN PATENT DOCUMENTS

JP 410012716 A * 6/1996

* cited by examiner

Primary Examiner—John F. Niebling
Assistant Examiner—Stanetta Isaac
(74) Attorney, Agent, or Firm—George O. Saile; Rosemary L. S. Pike

(57) ABSTRACT

A method of forming a shallow trench isolation (STI), region in a semiconductor substrate featuring a process sequence that results in desired rounded corners for the sides of active device regions located butting the STI region, has been developed. The process sequence features formation of, followed by removal of, a silicon dioxide layer which was thermally grown in a top portion of the semiconductor substrate, wherein the top portion of semiconductor was subjected to an ion implantation procedure prior to the oxidation procedure. The above process sequence results in a recessed portion of semiconductor located adjacent to unoxidized portions of semiconductor which underlay an oxidation resistant shape, and feature rounded corners. Insulator spacers are then formed on the sides of the oxidation resistant shape, overlying and protecting the rounded corners of subsequent active device regions from a dry etch procedure used to selectively define a shallow trench shape in the exposed semiconductor region. Insulator filling and planarization procedures result in the formation of an STI region, located adjacent to active device regions which feature the desired rounded corners.

29 Claims, 4 Drawing Sheets

METHOD OF FORMING SHALLOW TRENCH ISOLATION REGIONS WITH IMPROVED CORNER ROUNDING

BACKGROUND OF THE INVENTION (1) Field of the Invention

The present invention relates to methods use to fabricate semiconductor devices, and more specifically to a method of forming shallow trench isolation (STI), regions, with improved corner rounding at the STI-semiconductor interface.

(2) Description of Prior Art

The advent of micro-miniaturization, or the ability to fabricate semiconductor devices with sub-micron features, has resulted in the migration from LOCOS, (local oxidation of silicon), isolation technology to an STI isolation technology. Narrow active device regions, comprised with sub-micron features become difficult to maintain when isolation regions are formed via LOCOS technology. Birds beak formation, or encroachment of the silicon dioxide isolation region obtained via thermal oxidation procedures, into the adjacent silicon regions result in undesirable consumption of the designed active device region. The use of STI allows the design dimensions of the active device region to be maintained due to the absence of a thermal oxidation procedure used to grow a thick silicon dioxide isolation region. The STI regions are formed via definition of shallow trench shapes in a top portion of a semiconductor substrate, followed by insulator filling and planarization procedures.

The STI technology while not consuming adjacent silicon of an active device region, however presents other unwanted phenomena, again at the isolation region-semiconductor interface. The dry etch procedures used to define the shallow trench shapes in a top portion of the semiconductor substrate, create a sharp corner in the active device region at the STI-semiconductor interface. The sharp corner can result in an unwanted high electric field region for the active device region, translating to deleterious device parameters such as sub-threshold leakage.

This invention will describe a novel process sequence for fabrication of STI regions, in which corner rounding of adjacent active device regions is reduced. This is accomplished via use of a combination of process steps, such as formation and removal of a thin LOCOS region, and insulator spacer formation performed prior to definition of the shallow trench shapes. Prior art, such as Gambino et al, in U.S. Pat. No. 6,084,276, Reinberg, in U.S. Pat. No. 6,265,281 B1, Jang et al, in U.S. Pat. No. 6,037,018, and Lin et al, in U.S. Pat. No. 6,207,532 B1, describe methods of forming STI regions as well as methods addressing corner rounding. None of these prior art however describe the novel process sequence used in the present invention, in which a combination of steps such as thin LOCOS formation and removal and formation of sidewall spacers, are employed prior to definition of the shallow trench shapes.

SUMMARY OF THE INVENTION

It is an object of this invention to form STI regions in a top portion of a semiconductor substrate, wherein the STI regions are located adjacent to active device regions which feature rounded corners at the active device region—STI interface.

It is another object of this invention to form and then remove, a thin, LOCOS region from a top surface of a first region of semiconductor to be used to accommodate an STI region, resulting in rounded corners for an adjacent, second region of semiconductor to be used for an active device region.

It is still another object of the invention to form insulator spacers on the sides of an insulator shape overlying the active device region, with the insulator spacers overlying a portion of the rounded corners of the active device region.

It is still yet another object of this invention to define the shallow trench shapes in a top portion of the first region of semiconductor, in an area in which the first region of semiconductor is not covered by the insulator spacers.

In accordance with the present invention a method of forming an STI region in a top portion of a semiconductor substrate, in which corner rounding of the portion of active device region located adjacent to the STI region is obtained, is described. After formation of an opening in a oxidation resistant material exposing a first region of semiconductor, an ion implantation procedure is performed to prepare the first region of semiconductor for an oxidation procedure. Formation of a thin LOCOS region in the implanted, first region of semiconductor is followed by removal of the thin LOCOS region, resulting in a recessed first region of semiconductor featuring rounded corners in an adjacently located second region of semiconductor, the subsequent active device region now underlying the oxidation resistant shape. Insulator spacers are formed on the sides of the oxidation resistant shape, overlying the rounded corners of the recessed, first region or semiconductor. Definition of a shallow trench shape is next accomplished in the portion of the recessed, first region of semiconductor, not covered by the insulator spacers. After thermal growth of an insulator liner layer on the exposed surfaces of the shallow trench shape, additional insulator layer is deposited completely filling the shallow trench opening. Selective removal of unwanted portions of the deposited insulator layer from the top surface of the oxidation resistant shape, results in an STI region located adjacent to an active device region, wherein the active device region in turn features rounded corners overlaid by insulator spacers.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

Figure 1:
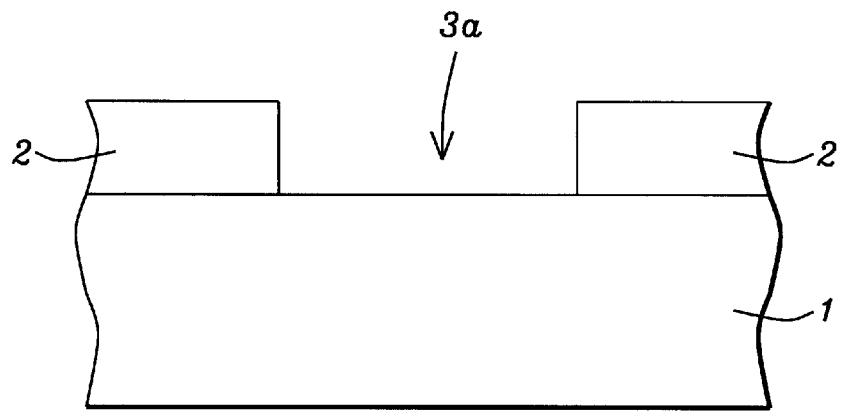
FIGS. 1–10, which schematically, in cross-sectional style, describe key stages for the formation of an STI region in a top portion of a semiconductor substrate, in which corner rounding of the portion of active device region located adjacent to the STI region is obtained.
Figure 2:
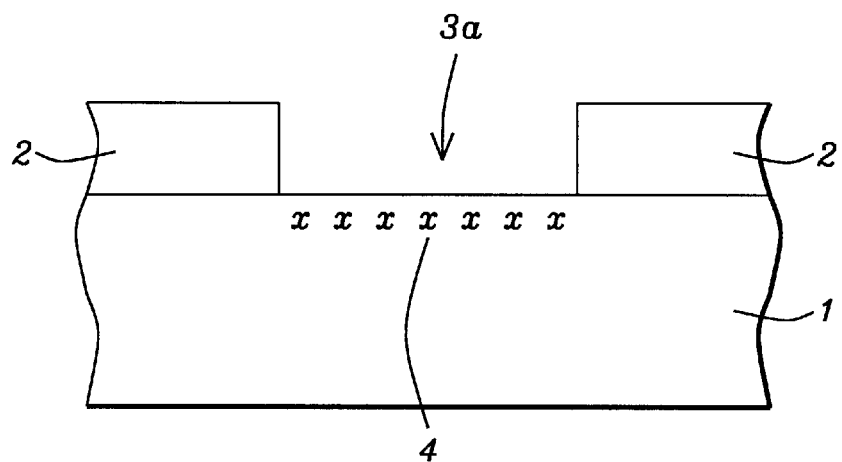

The method of forming an STI region in a top portion of a semiconductor substrate, featuring corner rounding of the portion of active device region located adjacent to the STI region, will now be described in detail. Semiconductor substrate 1, comprised of single crystalline silicon, featuring a <100> crystallographic orientation, is used and schematically shown in FIG. 1. Silicon nitride layer 2, is next deposited via low pressure chemical vapor deposition (LPCVD), or via plasma enhanced chemical vapor deposition (PECVD), procedures, to a thickness between about 1000 to 2000 Angstroms. If desired a thin silicon oxide layer can be formed on the surface of semiconductor substrate 1, prior to deposition of silicon nitride layer 2. A photoresist shape, not shown in the drawings, is next employed as an etch mask allowing an anisotropic reactive ion etch (RIE), procedure, using $Cl_2$ as an etchant, to define opening 3a, in silicon nitride layer 2, exposing a top surface of a first of semiconductor substrate 1. The width of opening 3a, is between about 0.10 to 0.50 um. Removal of the photoresist shape used for definition of opening 3a, is accomplished via plasma oxygen ashing. The result of these procedures is schematically shown in FIG. 1.

Prior to growth of a thin silicon dioxide layer via a local oxidation of silicon (LOCOS), procedure, the semiconductor regions to be subjected to the LOCOS procedure are first subjected to an ion implantation procedure to prepare the semiconductor regions for the oxidation procedure. The procedure is performed via implantation of boron ions, at an energy between about 0.5 to 3 KeV, at a dose between about 1E14 to 1E15 atoms/cm$^2$, and using an implant angle between about 0 to 7°. Implanted region 4, schematically shown in FIG, 2, will allow the thickness of a subsequent thin silicon dioxide layer to be the same for both narrow and wide STI regions. Although only one subsequent STI region, opening 3a, with a specific width is shown in the drawings, multiple openings, with various widths are formed, to allow STI regions with various widths to be realized.

Figure 3:
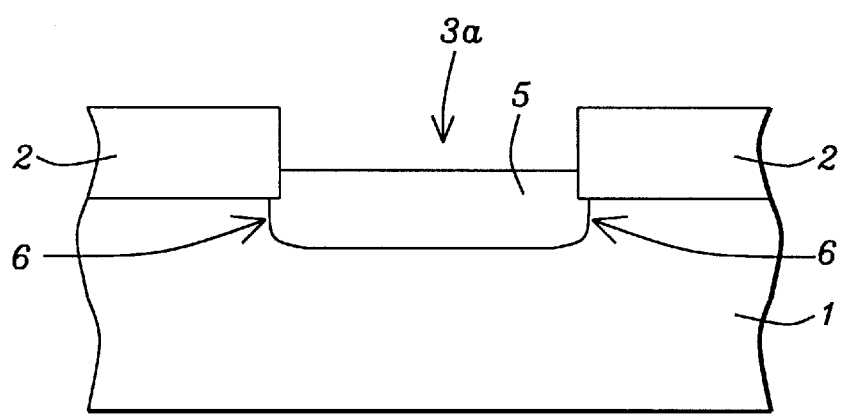
Figure 4:
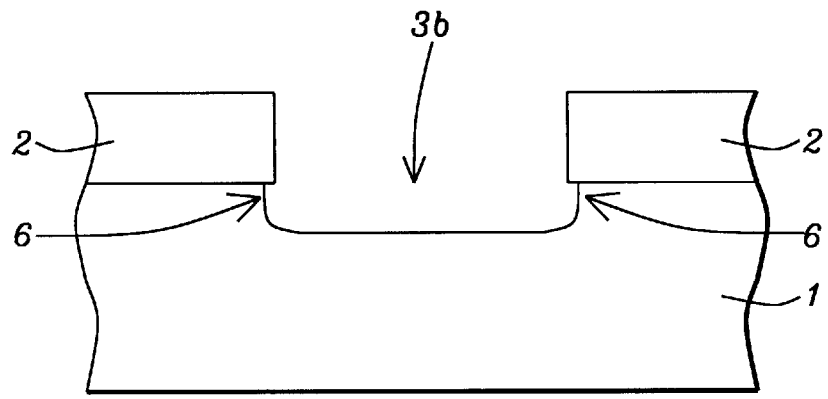
Figure 5:
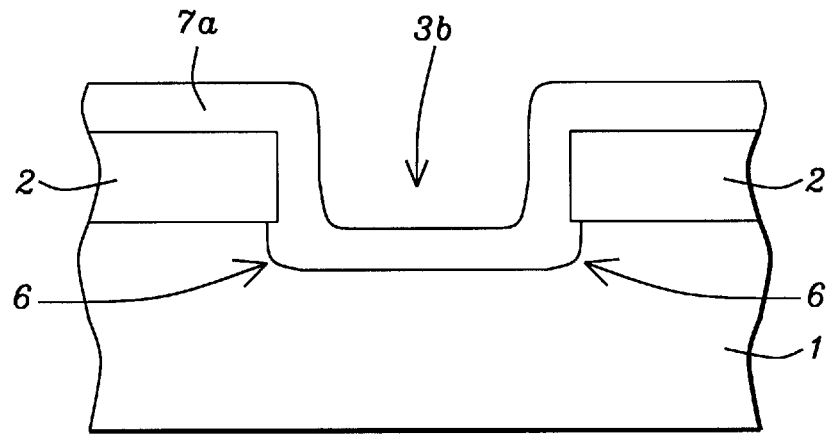
Figure 6:
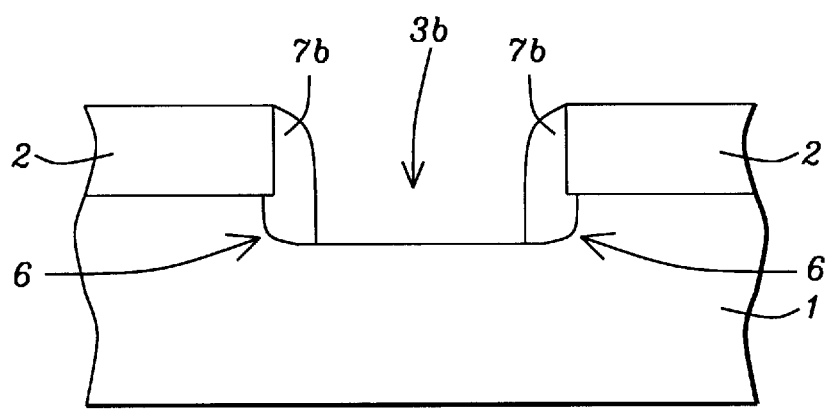

A thermal oxidation procedure is next performed at a temperature between about 750 to 850° C., in an oxygen ambient, resulting in the growth of silicon dioxide layer 5, in the region of semiconductor substrate 1, exposed in opening 3a. The thickness of the LOCOS formed silicon dioxide layer 5, shown schematically in FIG. 3, is between about 100 to 300 Angstroms. Of greatest importance is the formation of rounded corners 6, of the portion of semiconductor located underlying the edges of silicon nitride shapes 2, adjacent to silicon oxide layer 5. The combination of implantation and LOCOS conditions used, allowed rounded corners 6, to be obtained. Selective removal of silicon oxide layer 5, via use of a buffered hydrofluoric acid solution results in opening 3b, now comprised of the opening in the silicon nitride shape, and the underlying recess in semiconductor substrate, the space resulting from removed silicon oxide layer 5. The recessed portion of semiconductor substrate 1, still features rounded corners 6, located near the edges of silicon nitride shape 2. This is schematically shown in FIG. 4. The formation of insulator spacers on the sides of silicon nitride shape 2, and overlying rounded corners 6, is next addressed and schematically using FIGS. 5–6. Silicon oxide layer 7a, is conformally deposited via LPCVD or PECVD procedures to a thickness between about 100 to 250 Angstroms. A selective, anisotropic RIE procedure using $CHF_3$ as an etchant is then employed to define insulator spacers 7b, on the sides of silicon nitride shape 2, and more importantly overlying rounded corners 6. The presence of insulator spacers 7b, will protect rounded corners 6, from subsequent etching procedure, such as definition procedure used to form shallow trench shapes.

Figure 7:
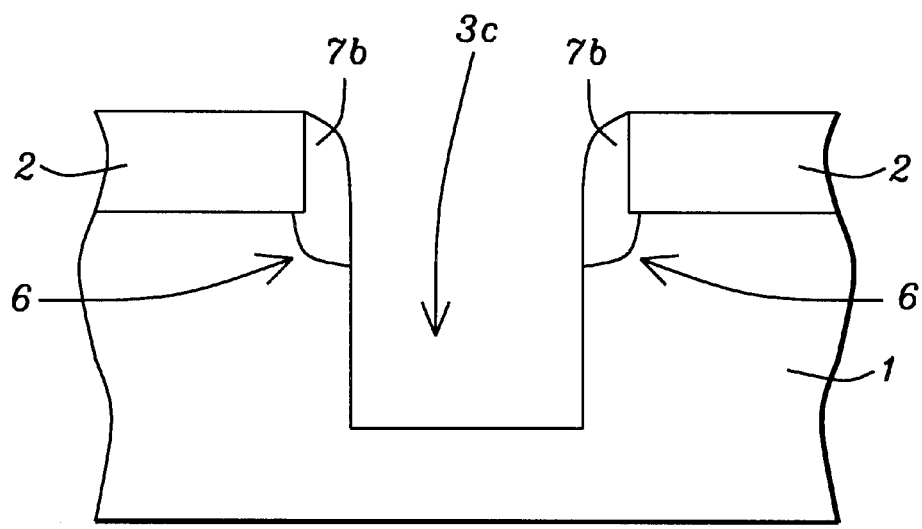

A selective, anisotropic RIE procedure using $SF_6$ as an etchant for silicon, is next employed to define a shallow trench shape in an exposed region of a top portion of semiconductor substrate 1, a region not covered by silicon nitride shape 2, or by insulator spacers 7b. Some thinning of exposed silicon nitride shape can occur during this procedure, but if desired a photoresist shape can be used to protect silicon nitride shape 2, during the selective dry etch procedure used to define the shallow trench shape. Shallow trench shape 3c, shown schematically in FIG. 7, is formed to a depth between about 3000 to 4500 Angstroms in semiconductor substrate 1. The width of the shallow trench shape shown in FIG. 7, is now between about 0.12 to 0.45 um, although other shallow trench shapes, located in other regions of the semiconductor substrate can be formed with either narrower or wider dimensions. The presence of insulator spacers 7b, protected rounded corners 6, from the shallow trench shape definition procedure.

Figure 8:
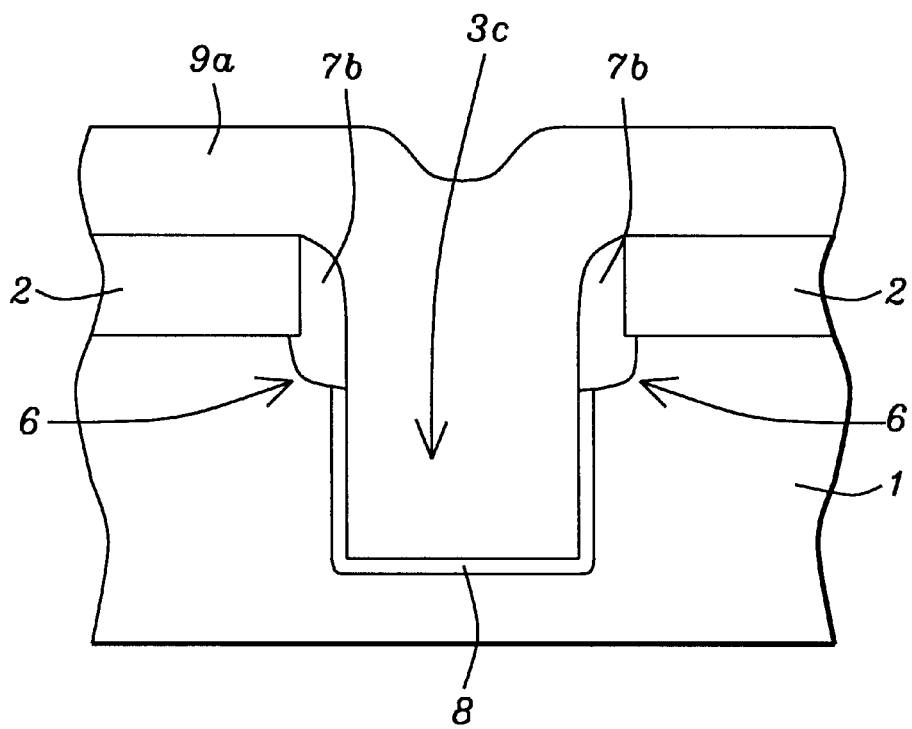

A thermal oxidation procedure is next used to form silicon dioxide liner layer 8, at a thickness between about 50 to 350 Angstroms, on the exposed surfaces of shallow trench shape 3c. Silicon dioxide liner layer 8, thermally grown in an oxygen—steam ambient, at a temperature between about 800 to 900° C., will provide a denser insulator layer interfacing active device regions, than a more porous chemically vapor deposited, silicon oxide layer that will be used to fill shallow trench shape 3c. A high density plasma (HDP), procedure is next employed for deposition of silicon oxide layer 9a. Silicon oxide layer 9a, deposited to a thickness between about 6000 to 8000 Angstroms, using tetraethylorthosilicate (TEOS), as a source, completely fills shallow trench shape 3c. This is schematically shown in FIG. 8.

Figure 9:
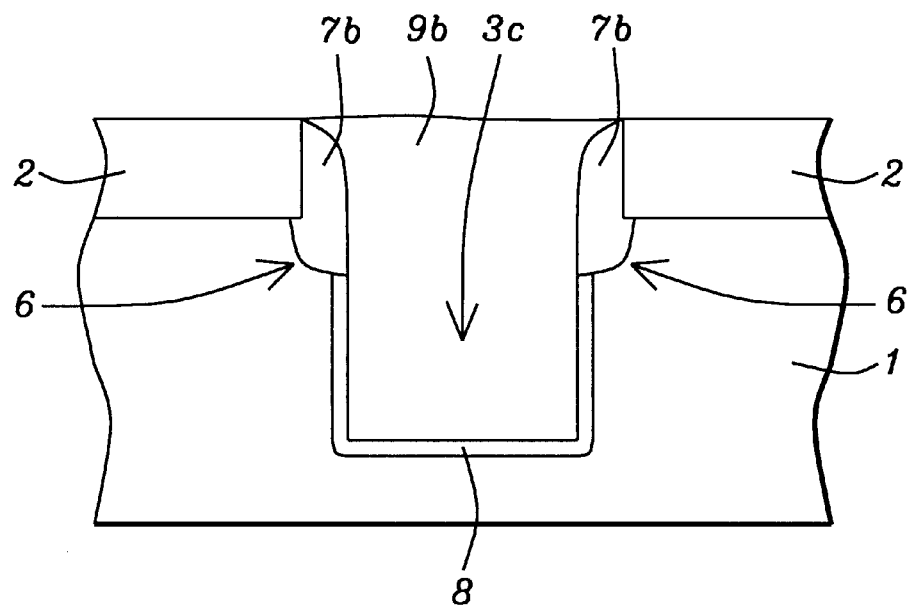
Figure 10:
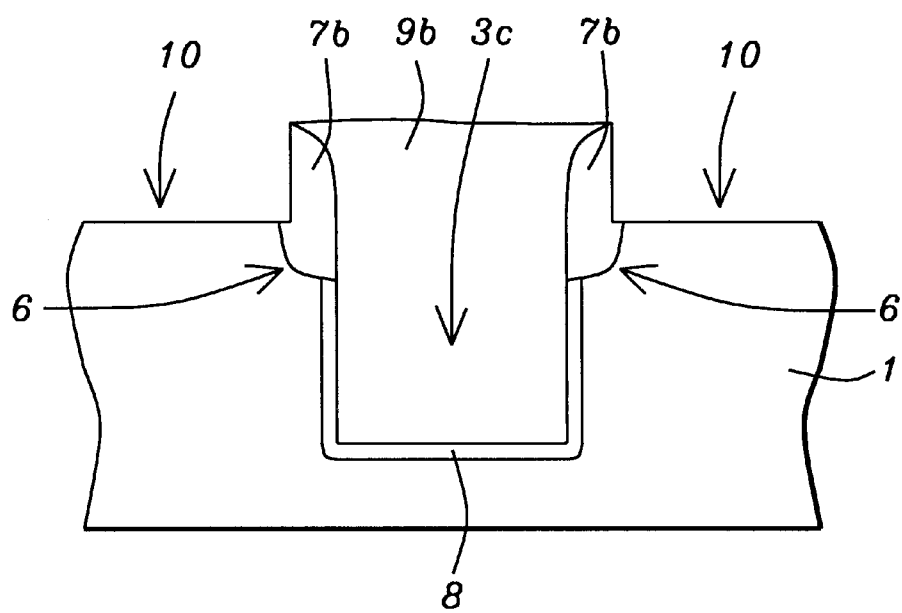

A chemical mechanical polishing (CMP), procedure is now used to selectively remove portions of silicon dioxide layer 9a, from the top surface of silicon nitride shape 2, resulting in a planarized STI structure comprised of silicon dioxide plug structure 9b, insulator spacers 7b, and silicon dioxide liner layer 8. This is schematically shown in FIG. 9. Selective removal of silicon nitride shape 2, is then accomplished via use of a hot phosphoric acid solution, exposing semiconductor regions 10, to be used for the active device region of the subsequent MOSFET device. Rounded corners 6, of semiconductor portions 10, shown schematically in FIG. 10, will prevent high electric fields and thus unwanted device parameters such as poor sub-threshold voltage, from occurring at the periphery of active device regions. The rounded corners in turn were established via the novel STI procedure featuring LOCOS growth and removal, as well as the presence of insulator spacer, formed in the subsequent STI region prior to definition of shallow trench shape.

While this invention has been particularly shown and described with reference to, the preferred embodiments thereof, it will be understood by those skilled in the art that various changes in form and details may be made without departing from the spirit and scope of this invention.

What is claimed is:

1. A method of forming a shallow trench isolation (STI), region in a semiconductor substrate, comprising the steps of:

forming an oxidation resistant shape featuring an opening which exposes a first region of said semiconductor substrate;

performing an ion implantation procedure in a top portion of said first region of said semiconductor substrate, growing an insulator layer in implanted portion of said first region of said semiconductor substrate resulting in rounded corners on the sides of second regions of said semiconductor substrate, wherein said second regions of said semiconductor layer are located underlying said oxidation resistant shape, adjacent to said insulator layer;

removing said insulator layer resulting in a recessed first region of said semiconductor substrate;

forming insulator spacers on sides of said oxidation resistant shape, overlying said rounded corners of said second regions of said semiconductor substrate;

forming a shallow trench shape in a portion of said recessed first region of said semiconductor substrate not covered by said insulator spacers;

forming an insulator layer liner on the sides of said shallow trench shape;

forming an insulator plug in said shallow trench opening resulting in said STI region comprised of said insulator plug, said insulator liner layer, and said insulator spacers located on said rounded corners; and removing said oxidation resistant shape.

2. The method of claim 1, wherein said oxidation resistant shape is comprised of silicon nitride.

3. The method of claim 1, wherein the width of said opening in said oxidation resistant shape is between about 0.10 to 0.50 um.

4. The method of claim 1, wherein said ion implantation procedure is performed using boron ions, at an energy between about 0.5 to 3 KeV, at a dose between about 1E14 to 1E15 atoms/cm$^2$, and using an implantation angle between about 0 to 7°.

5. The method of claim 1, wherein said insulator layer is a silicon dioxide layer, thermally grown in an oxygen ambient, at a temperature between about 750 to 850° C.

6. The method of claim 1, wherein the thickness of said insulator layer is between about 100 to 300 Angstroms.

7. The method of claim 1, wherein said insulator layer is removed via a wet etch procedure, using a buffered hydrofluoric acid solution as an etchant.

8. The method of claim 1, wherein said insulator spacers are comprised of silicon oxide, at a thickness between about 100 to 250 Angstroms.

9. The method of claim 1, wherein said shallow trench shape is formed via an anisotropic reactive ion etch procedure, using $SF_6$ as an etchant.

10. The method of claim 1, wherein the depth of said shallow trench shape in said semiconductor substrate, is between about 3000 to 4500 Angstroms.

11. The method of claim 1, wherein the width of said shallow trench shape in said semiconductor substrate, is between about 0.12 to 0.45 um.

12. The method of claim 1, wherein said insulator liner layer is a silicon dioxide layer, obtained at a thickness between about 50 to 350 Angstroms via a thermal oxidation procedure.

13. The method of claim 1, wherein said insulator plug located in said shallow trench shape is comprised of silicon oxide, obtained via a high density plasma (HDP), procedure, using tetraethylorthosilicate as a source.

14. The method of claim 1, wherein said oxidation resistant shape is removed via a wet etch procedure, using a hot phosphoric acid solution as an etchant.

15. A method of forming a shallow trench isolation (STI), region in a semiconductor substrate, comprising the steps of:

forming a silicon nitride shape on said semiconductor substrate, featuring an opening which exposes a first region of said semiconductor substrate;

performing an ion implantation procedure to a top portion of said first region of said semiconductor substrate;

performing a first thermal oxidation procedure to grow a first silicon dioxide layer in said first region of said semiconductor substrate, consuming implanted region, with said first thermal oxidation procedure allowing the sides of second regions of said semiconductor substrate, located underlying said silicon nitride shape and adjacent to said first silicon dioxide layer, to be defined with rounded corners;

performing a first wet etch procedure to selectively remove said first silicon dioxide layer resulting in a recessed first region of said semiconductor substrate;

depositing a first silicon oxide layer;

performing a first anisotropic reactive ion etching (RIE) procedure to form silicon oxide spacers on the sides of said silicon nitride shape, with said silicon oxide spacers overlying said rounded corners of said second regions of said semiconductor substrate;

performing a second anisotropic RIE procedure to form a shallow trench shape in a portion of said recessed first region of said semiconductor substrate not covered by said silicon oxide spacers;

performing a second thermal oxidation procedure to grow a second silicon dioxide layer on the sides of said shallow trench shape;

depositing a second silicon oxide layer completely filling said shallow trench shape;

performing a chemical mechanical polishing procedure to remove portions of said second silicon oxide layer from the top surface of said silicon nitride shape resulting in said STI region comprised of a silicon oxide plug obtained from said second silicon oxide layer located in center of said STI shape, of said second silicon dioxide layer located on the sides of said shallow trench shape, and of said silicon oxide spacers located on said rounded corners; and performing a second wet etch procedure to remove said silicon nitride shape.

16. The method of claim 15, wherein said silicon nitride shape is defined from a silicon nitride layer in turn obtained at a thickness between about 1000 to 2000 Angstroms via LPCVD or PECVD procedures.

17. The method of claim 15, wherein the width of said opening in said silicon nitride shape is between about 0.10 to 0.50 um.

18. The method of claim 15, wherein said ion implantation procedure is performed using boron ions, at an energy between about 0.5 to 3 KeV, at a dose between about 1E14 to 1E15 atoms/cm$^2$, and using an implantation angle between about 0 to 7°.

19. The method of claim 15, wherein said first thermal oxidation procedure, used to grow said first silicon dioxide layer, is performed in an oxygen ambient, at a temperature between about 750 to 850° C.

20. The method of claim 15, wherein the thickness of said first silicon dioxide layer is between about 100 to 300.

21. The method of claim 15, wherein said first wet etch procedure, used to remove said first silicon dioxide layer, is performed using a buffered hydrofluoric acid solution as an etchant.

22. The method of claim 15, wherein said first silicon oxide layer is obtained via LPCVD or PECVD procedures, at a thickness between about 100 to 250 Angstroms.

23. The method of claim 15, wherein said first anisotropic RIE procedure, used to define said silicon oxide spacers, is performed using $CHF_3$ as an etchant.

24. The method of claim 15, wherein said second anisotropic RIE procedure, used to form said shallow trench shape, is performed using $SF_6$ as an etchant.

25. The method of claim 15, wherein the depth of said shallow trench shape in said semiconductor substrate, is between about 3000 to 4500 Angstroms.

26. The method of claim 15, wherein the width of said shallow trench shape in said semiconductor substrate, is between about 0.12 to 0.45 um.

27. The method of claim 15, wherein said second silicon dioxide layer is grown to a thickness between about 50 to 350 Angstroms, via said second thermal oxidation procedure.

28. The method of claim 15, wherein said second silicon oxide layer, used to fill said shallow trench shape, is obtained at a thickness between about 6000 to 8000 Angstroms, via a high density plasma (HDP), procedure, using tetraethylorthosilicate as a source.

29. The method of claim 15, wherein said second wet etch procedure, used to remove said silicon nitride shape, is performed using hot phosphoric acid as an etchant.

* * * * *